United States Patent [19]

Spangler

[11] Patent Number: 5,632,649
[45] Date of Patent: May 27, 1997

[54] HOLD-DOWN DEVICE FOR A BOARD MOUNT CONNECTOR

[75] Inventor: Todd M. Spangler, Charlotte, N.C.

[73] Assignee: The Whitaker Corporation, Wilmington, Del.

[21] Appl. No.: 362,680

[22] Filed: Dec. 22, 1994

[51] Int. Cl.$^6$ ................................................ H01R 13/60
[52] U.S. Cl. ................................................ 439/567
[58] Field of Search ................................ 439/567, 571, 439/557

[56] References Cited

U.S. PATENT DOCUMENTS

| | | | |
|---|---|---|---|
| 4,681,389 | 7/1987 | Nakazawa et al. | 439/557 |
| 4,701,004 | 10/1987 | Yohn | 439/871 |
| 4,943,244 | 7/1990 | Teck et al. | 439/567 |
| 5,080,611 | 1/1992 | Hypes | 439/567 |
| 5,115,375 | 5/1992 | Garay | 439/567 |
| 5,120,257 | 6/1992 | Hahn | 439/567 |
| 5,145,407 | 9/1992 | Obata et al. | 439/567 |
| 5,154,634 | 10/1992 | Brown et al. | 439/555 |
| 5,171,165 | 12/1992 | Hwang | 439/567 |
| 5,184,963 | 2/1993 | Ishikawa | 439/567 |
| 5,228,870 | 7/1993 | Gorenc et al. | 439/567 |
| 5,336,111 | 8/1994 | Thrush et al. | 439/567 |

FOREIGN PATENT DOCUMENTS

77211129 of 1990 Taiwan.
78211403 of 1991 Taiwan.

*Primary Examiner*—Neil Abrams
*Assistant Examiner*—Eugene G. Byrd
*Attorney, Agent, or Firm*—Anton P. Ness

[57] ABSTRACT

An improved hold-down system for securing an electrical connector assembly (1) to a circuit board (31) includes an insulative housing (5) having a plurality of cavities (11) adapted to receive a corresponding plurality of electrical contacts (10). The insulative housing (5) has at least one cavity (26) adapted to receive an improved hold-down device (15). The hold-down device (15) comprises a unitary planar construction, having a uniform thickness, and includes an upper portion (52) having two outwardly projecting stops (56) that are adapted to resiliently engage an internal portion of cavity (26). Two legs (54) extend downwardly from upper portion (52) in spaced-apart relation. Each leg (54) has at least one outwardly projecting barb (72) sized so as to engage a corresponding side wall (33) of an aperture (30) in circuit board (31). A retention wing (70) is positioned on an outer edge (76) of each leg (54). Each retention wing (70) includes an upwardly and outwardly projecting beam that is sized so as to (i) resiliently flex inwardly during insertion of hold-down device (15) into the cavity (26), and (ii) resiliently flex outwardly once stops (56) have resiliently engaged cavity (26) so as to fasten hold-down device (15) to insulative housing (5).

15 Claims, 7 Drawing Sheets

HOLD-DOWN DEVICE FOR A BOARD MOUNT CONNECTOR

FIELD OF THE INVENTION

The present invention relates generally to board mount electrical connectors, and more particularly to an improved device for securing an electrical connector to a circuit board.

BACKGROUND OF THE INVENTION

Hold-down devices are often used to secure an electrical connector assembly to a circuit board. For example, U.S. Pat. No. 5,228,870 discloses an arrangement for securing an electrical connector to a circuit board which includes a planar barbed holding device that is installed within a recess of a mounting portion of an electrical connector assembly. The barbed holding device is adapted to be inserted into an appropriately aligned cavity in the circuit board so as to attach the electrical connector assembly to the circuit board. The recess of the electrical connector is formed with an inner wall for limiting the extent of insertion of the holding device. Depth compensation protrusions are also provided on the inner wall of the recess to ensure proper orientation and seating of the holding device relative to the electrical connector assembly.

In another example, U.S. Pat. No. 5,184,963 discloses an electrical connector assembly which includes a housing for holding electrical contacts on close spacing. The housing includes an alignment post that is integrally formed with the contacts, via a coupled carrier section, to tie the contact's position and the alignment post's position together dimensionally. The alignment post includes a slot that is adapted for receiving a fastener. The fastener is fitted in the slot, and includes barbs that project therefrom so as to latch the post (and hence the housing) to a circuit board.

In a further example, U.S. Pat. No. 5,171,165 discloses an electrical connector assembly which includes a resilient hold-down device for securely fastening the electrical connector assembly to a circuit board. The hold-down device comprises a horizontal base, and a pair of spaced arms that are bent upwardly at a right angle from opposite sides of the base in substantially parallel relationship. A pair of legs extend downwardly from the base in spaced-apart relation from one another, being bent downward at a right angle along the longitudinal edge of the base. The legs further include side projections for engagement with the periphery of an aperture in a circuit board. Retention lugs are formed from portions of the upwardly extending arms. The retention lugs are bent outwardly so as to resiliently engage the sides of a receiving aperture in an insulating housing of the electrical connector. Shoulders positioned within the receiving aperture are adapted to engagably retain the lugs.

In a still further example, U.S. Pat. No. 5,154,634 discloses an electrical connector assembly which includes a holding device for securing the electrical connector assembly to a circuit board. The holding device includes a U-shaped leading end that has a pair of leg portions disposed adjacent thereto. The U-shaped leading end is adapted to be received in an aperture in the circuit board. The leg portions extend to free ends, and define a retaining section that is adapted to be received by a recess within the connector's housing. The recess includes a central wall portion having lead-in engagement sites. The lead-in engagement sites cooperate with the legs to secure the device within the housing. When the legs are inserted into the housing recess, and the U-shaped leading end of the device is inserted into the circuit board aperture, interference projections on the spring means compressively engage the aperture wall surfaces, which in turn causes the legs of the U-shaped leading end to be moved inwardly toward each other. As a result, the leg sections in the recess pivot about the lead-in engagement sites so as to move the retaining section into tighter engagement with the walls of the recess. This action drives the U-shaped portion outwardly to secure the electrical connector assembly to the circuit board.

In yet a further example, U.S. Pat. No. 4,681,389 discloses a lock pin for mounting electrical connectors to a circuit board. The lock pin comprises an elastic material. It includes an upper lateral arm and a pair of spaced long central legs that extend downwardly from the center of the upper lateral arm. The lock pin also includes a pair of spaced short outside legs that extend downwardly from the upper lateral arm along the outsides of the central legs. The central legs are adapted to be inserted into an opening formed in the connector. The central legs are inserted into the opening from the upper surface side of the connector so as to project a significant distance below its lower side. The central legs are also adapted to be inserted into an opening in the circuit board. The central legs are formed, at their lower ends, with side projections that are adapted to engage the periphery of the opening in the circuit board. The outside legs are formed, at their lower ends, with side projections that are adapted to engage shoulders formed at the periphery of the opening in the connector.

SUMMARY OF THE INVENTION

The present invention provides an improved hold-down device adapted to secure an electrical connector assembly to a circuit board. The electrical connector assembly contemplated for use with the present invention comprises an insulative housing having a plurality of cavities adapted to receive a corresponding plurality of electrical contacts. The insulative housing further comprises at least one cavity adapted to receive the novel hold-down device.

The hold-down device of the present invention generally comprises a board-retention section, a first portion containing a pair of stops extending outwardly from side edges thereof, and a second portion containing a pair of beams or wings extending outwardly from side edges thereof and toward the stops, with the stops associated with the wings in pairs to abut respective first and second transverse surfaces of internal portions or shoulders of the receiving cavity and trap the shoulders therebetween upon full insertion. In the disclosed embodiment, the board-retention section extends from the second portion containing the pair of wings and is insertable into the receiving cavity by inserting the legs of the board-retention section into the receiving cavity at the board-remote face of the housing, until the legs extend from the board-proximate face and the pairs of wings and stops trap the shoulders to prevent further movement of the hold-down device in either direction along the receiving cavity.

The hold-down device may comprise a unitary planar construction having a uniform thickness, and the board-retention section is disclosed to comprise a pair of legs extending from the second section and from the board-proximate housing face to be inserted into and self-retain within an aperture in the circuit board. A retention wing is positioned on an outer edge of each leg. Each retention wing comprises an upwardly and outwardly projecting beam that is sized so as to (i) resiliently flex inwardly during insertion of the hold-down device into the receiving cavity, and (ii) resiliently flex outwardly, once the stops have resiliently engaged the aforementioned internal portions of the receiving cavity, so as to fasten the hold-down device to the insulative housing. In a preferred embodiment, each stop comprises a tip that projects from an outer end thereof. Each tip is sized and shaped so as to resiliently engage an aforementioned internal portion of the receiving cavity.

An objective of the invention is to provide an improved hold-down device suitable for use with a board mountable electrical connector assembly.

Another objective of the invention is to provide an improved interconnection system.

A further objective of the invention is to provide an improved method for securing an electrical connector to a circuit board.

A feature of the invention resides in a hold-down device having a unitary planar construction and a uniform thickness that resiliently snaps into place in a flange of an insulative housing.

BRIEF DESCRIPTION OF THE DRAWINGS

The preferred embodiment of the invention will now be described, by way of example, with reference being made to the accompanying drawings wherein like numerals refer to like parts and further wherein.

DETAILED DESCRIPTION OF THE PREFERRED EMBODIMENT

Figure 1:
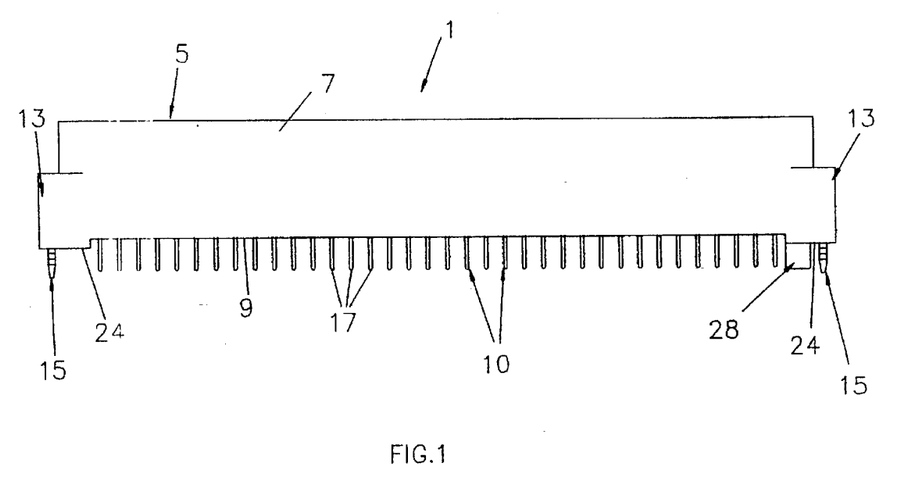
FIG. 1 is a side elevational view of an electrical connector assembly formed in accordance with the present invention.
Figure 2:
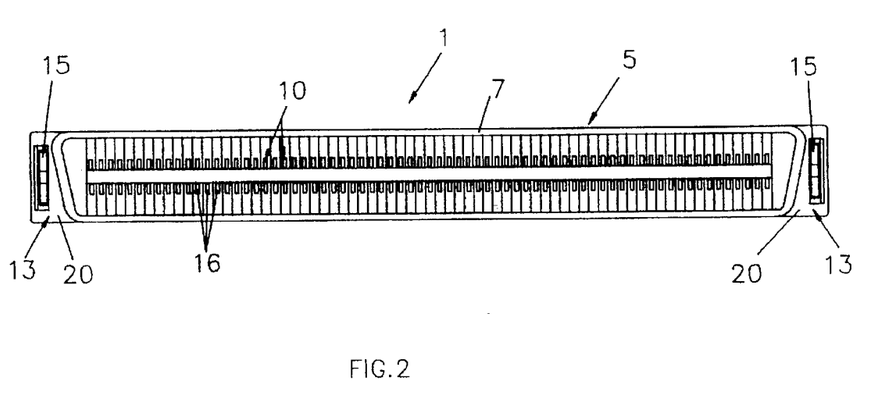
FIG. 2 is a plan view of the electrical connector assembly shown in FIG. 1.

Referring first to FIGS. 1 and 2, a circuit board mount electrical connector assembly 1 formed in accordance with the present invention comprises an insulative housing 5, a plurality of electrical contacts 10, and a pair of hold-down devices 15.

Figure 3:
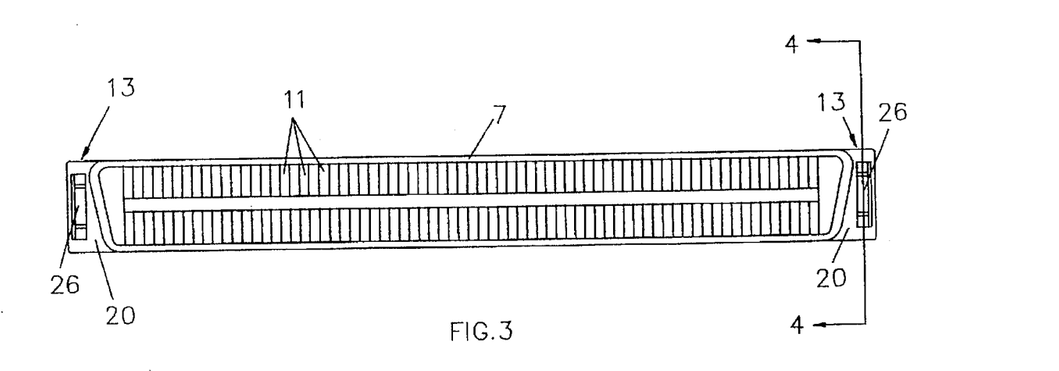
FIG. 3 is a plan view of an insulative housing used to form the electrical connector assembly shown in FIGS. 1 and 2.

More particularly, and now referring to FIGS. 1–3, insulative housing 5 comprises a top portion 7, a bottom portion 9, a plurality of electrical contact cavities 11 (FIG. 3), and a pair of flanges 13. Electrical contact cavities 11 extend through insulative housing 5 so as to communicate between top portion 7 and bottom portion 9. Each electrical contact cavity 11 is adapted to receive an electrical contact 10.

Electrical contacts 10 are of the type well known in the art for electrically and mechanically engaging a corresponding mating electrical contact disposed in a mating electrical connector assembly. It will, therefore, be understood that electrical contacts 10 generally comprise a contact mating portion 16 (FIG. 2) and a terminal portion 17 (FIG. 1). Contact mating portion 16 is typically positioned within top portion 7 of insulative housing 5 so as to be capable of mating with a corresponding mating portion of a mating electrical connector assembly (not shown). Terminal portion 17 extends outwardly from bottom portion 9 of insulative housing 5, and is adapted for electrical and mechanical interconnection to a circuit board by methods that are well known in the art. Further details regarding electrical contacts 10 are taught in U.S. Pat. Nos. 5,037,334 and 4,808,125, which patents are hereby incorporated herein by reference.

Figure 9:
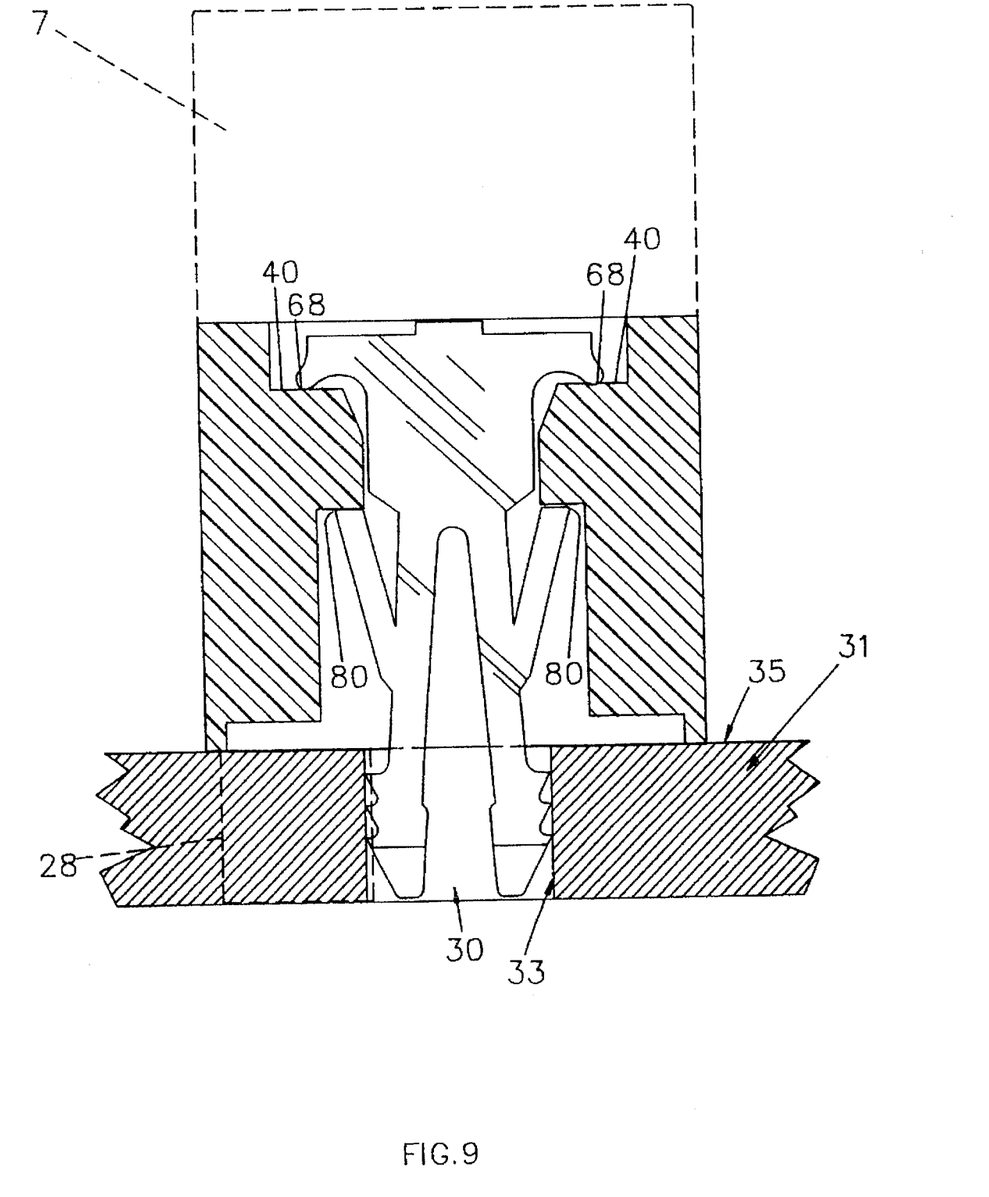
FIG. 9 is a side elevational view, partially in section and partially in phantom, showing a hold-down device fully inserted into a receiving cavity and a circuit board.

Referring now to FIGS. 1–4, two flanges 13 are positioned laterally on insulative housing 5. Each flange 13 comprises a top surface 20, a bottom surface 22, circuit board standoffs 24, and a cavity 26 adapted to receive a hold-down device 15. In addition, one flange further includes a polarization post 28 (FIGS. 1 and 4) that extends downwardly from bottom portion 9 of insulative housing 5. Polarization post 28 is sized and shaped so as to mate with a corresponding aperture (not shown) in circuit board 31 (FIG. 9). Polarization post 28 provides for a preferred orientation of electrical connector assembly 1 on circuit board 31. Circuit board standoffs 24 extend downwardly from bottom surface 22, and are adapted to provide clearance between the connector's insulative housing 5 and the circuit board's top surface 35 (FIG. 9) to allow for removal of cleaning fluxes during wave soldering.

As used herein, the term cavity is meant to refer to a void formed in the insulative housing and to the surrounding internal structures defining that void.

Figure 4:
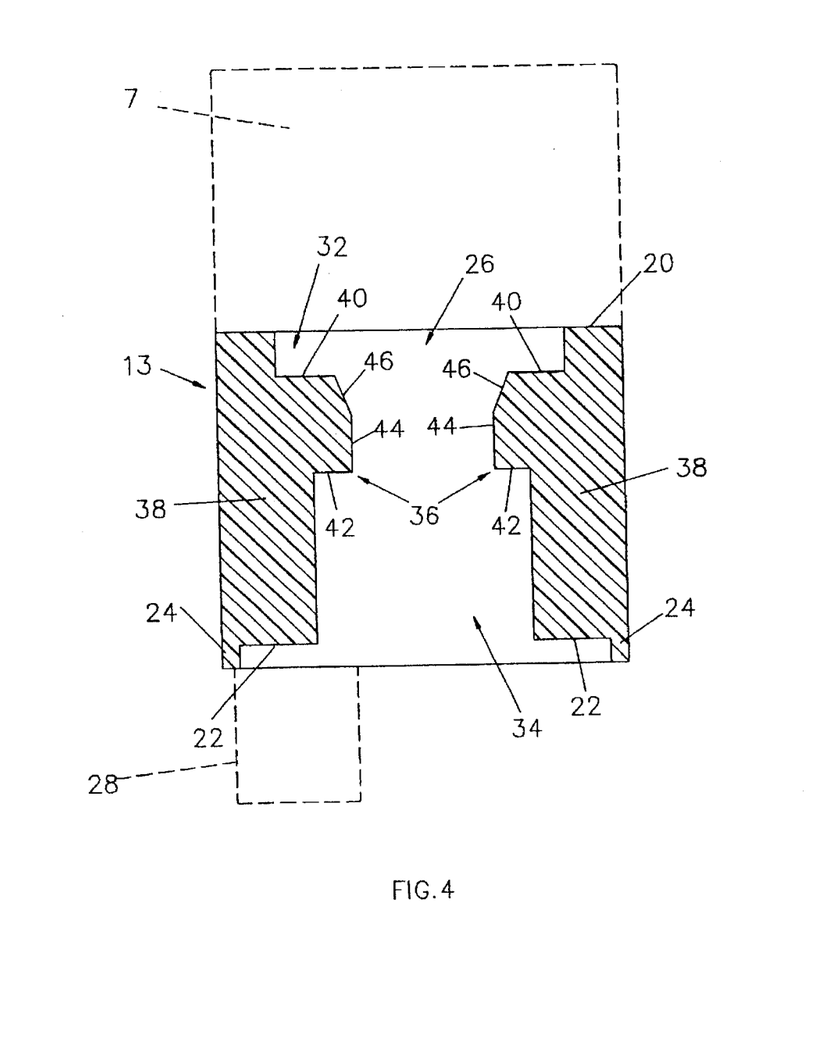
FIG. 4 is a cross-sectional view of a cavity for receiving a hold-down device, as taken along line 4—4 in FIG. 3.

Referring now to FIGS. 3 and 4, a receiving cavity 26 extends through each flange 13 so as to communicate between top or board surface 20 and bottom surface 22. Each receiving cavity 26 comprises an upper portion 32, a lower portion 34, and two shoulders 36. Upper portion 32 is shaped rectangularly, and extends downwardly into flange 13 from top surface 20. Lower portion 34 is also shaped rectangularly, and extends upwardly into flange 13 from bottom surface 22. Upper portion 32 and lower portion 34 each comprise a depth that is only slightly larger than the thickness of hold-down device 15.

Shoulders 36 are disposed in opposing relation between upper portion 32 and lower portion 34. Each shoulder 36 includes an upper surface 40, a lower surface 42, an inner surface 44 and a chamfered surface 46. Shoulders 36 project inwardly into cavity 26 from each side wall 38 so that inner surfaces 44 are disposed in spaced-apart confronting relation to one another defining a constriction within cavity 26. A gap is defined between the two confronting inner surfaces 44 of shoulders 36. Chamfered surfaces 46 are angled relative to inner surfaces 44 so as to reduce the force necessary to insert hold-down device 15 into cavity 26.

In a preferred embodiment, insulative housing 5 may be formed from various polymer materials of the type that have an intrinsically resilient nature, e.g., polyester.

The hold-down device of the present invention generally comprises a board-retention section, a first portion containing a pair of stops 56, and a second portion containing a pair of beams or wings 70, with the wings 70 associated with stops 56 in pairs to trap shoulders of the receiving cavity therebetween upon full insertion. In the embodiment shown herein, the board-retention section extends from the second portion containing the pair of wings 70 and is insertable into the receiving cavity by inserting the legs 72 of the board-retention section into the receiving cavity at the board-remote or top surface 20 of the housing, until legs 72 extend from the board-proximate or bottom surface 22 and the pairs of wings and stops trap the shoulder to prevent further movement of the hold-down device in either direction along the receiving cavity.

Figure 5:
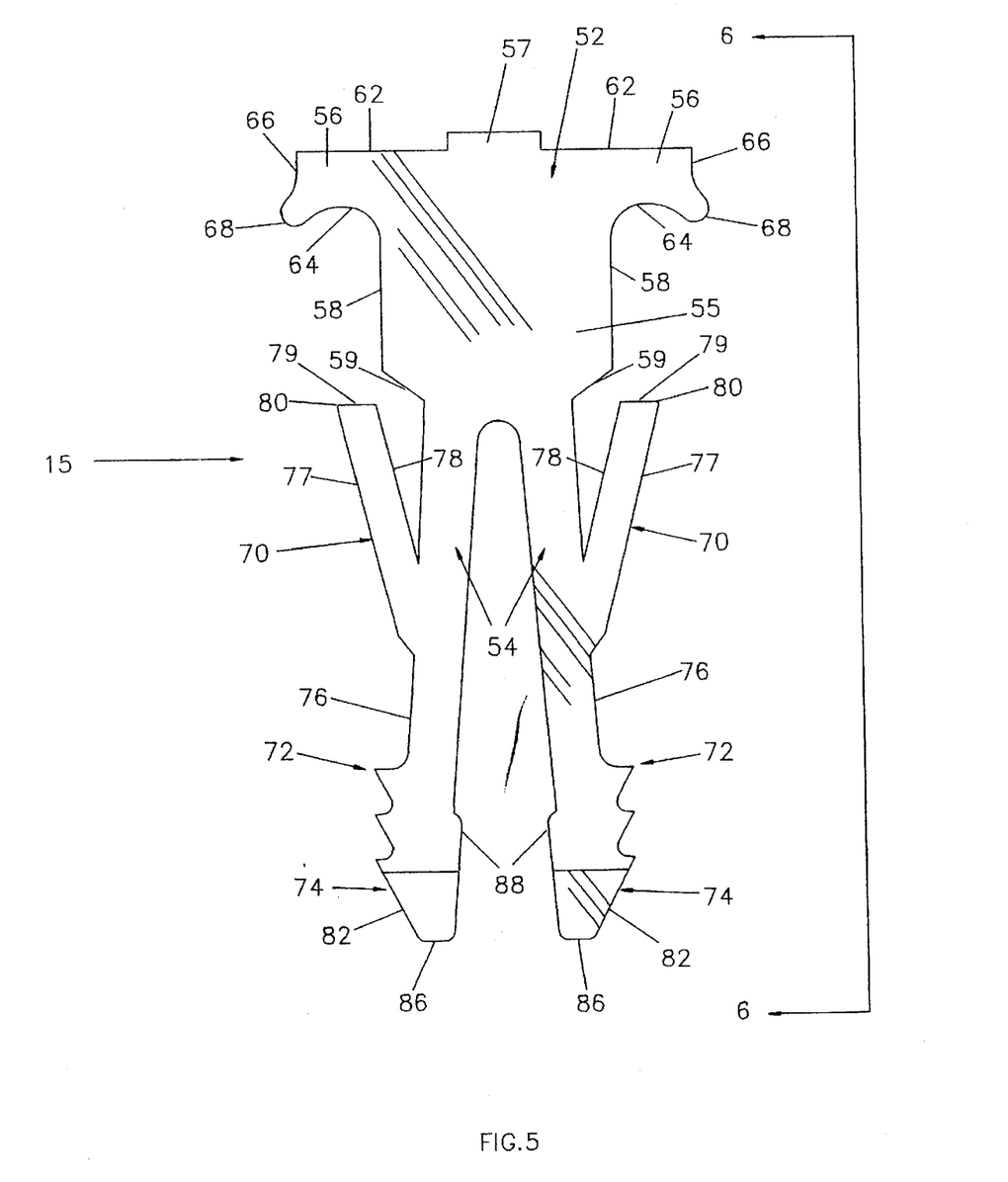
FIG. 5 is a plan view of a hold-down device formed in accordance with the present invention.
Figure 6:
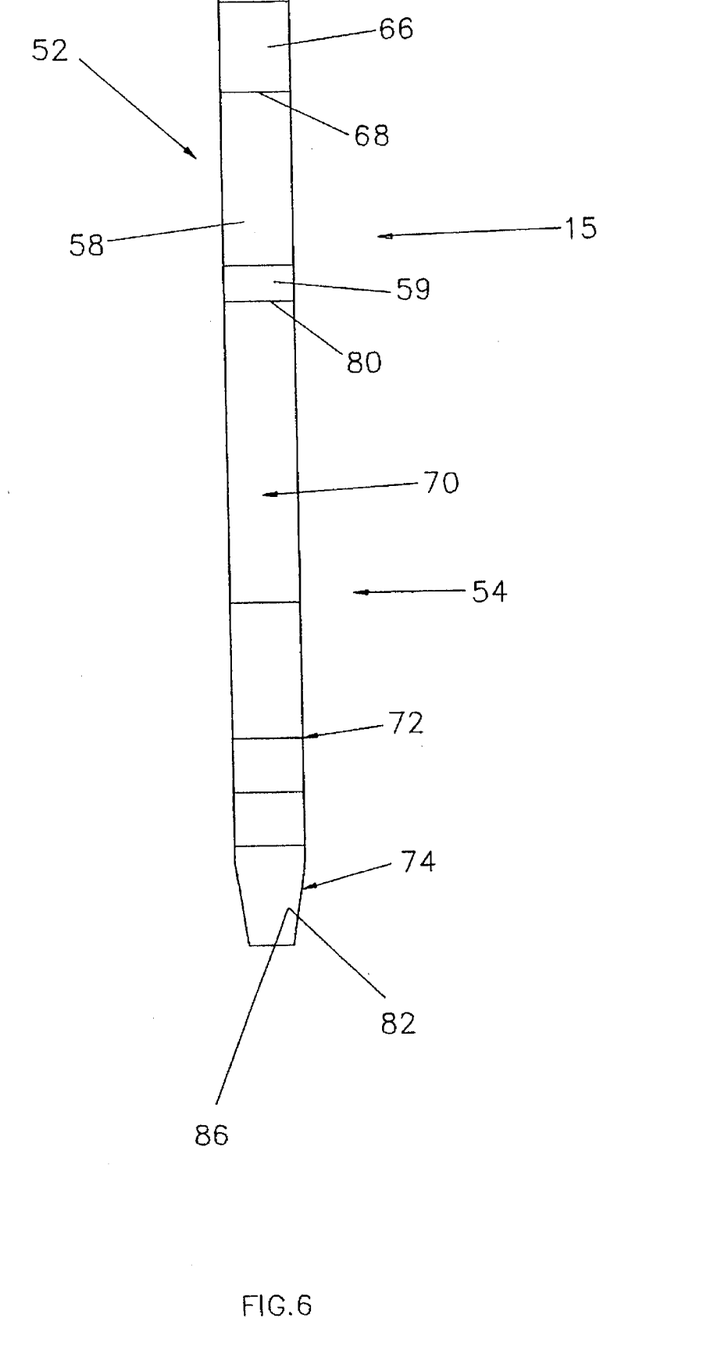
FIG. 6 is a side elevational view of the hold-down device, as taken along line 6—6 in FIG. 5.

Referring now to FIGS. 5 and 6, hold-down device 15 generally comprises an upper portion 52 and a pair of legs 54. As shown in FIG. 6, hold-down device 15 has a unitary planar construction and a uniform thickness.

More particularly, upper portion 52 includes a central portion 55, two stops 56, a tab 57, two lateral edges 58, and two chamfered edges 59. Central portion 55 is sized so that lateral edges 58 are spaced apart by a distance which is less than the width of the gap between inner surfaces 44 of shoulders 36. Chamfered edges 59 are disposed at the bottom of lateral edges 58. Chamfered edges 59 are angled with respect to lateral edges 58 so as to provide space to receive a portion of legs 54 during insertion of hold-down device 15 into cavity 26, as will hereinafter be disclosed in further detail.

Stops 56 project outwardly from the top of upper portion 52, and include upper edges 62, curved lower edges 64, and outer edges 66. Each upper edge 62 extends between each outer edge 66 and tab 57, on each side of upper portion 52. Stops 56 extend beyond lateral edges 58 so that upper portion 52 has an effective width, between outer edges 66, that is less than the width of upper portion 32 of cavity 26, but greater than the width of the gap between inner surfaces 44 of shoulders 36. A rounded tip 68 projects downwardly from the portion of stop 56 defined by the intersection of curved lower edge 64 and outer edge 66. Each tip 68 is adapted to resiliently engage upper surface 40 of each shoulder 36 upon full insertion of hold-down device 15 into cavity 26, as will hereinafter be disclosed in further detail.

Upwardly projecting tab 57 is centrally disposed on upper edges 62. Tab 57 is formed when hold-down device 15 is cut away from a carrier strip (not shown) during assembly. Tab 57 is adapted to be engaged by an insertion tool (not shown) during insertion of hold-down device 15 into insulative housing 5, as will hereinafter be disclosed in further detail.

Each leg 54 comprises a retention wing 70, at least one barb 72, and an end portion 74. Legs 54 extend downwardly from central portion 55 in diverging relation to one another. In this configuration, end portions 74 are spaced apart by a distance sufficient to (i) enable both legs 54 to elastically engage shoulders 36 of cavity 26 so as to pass easily through the gap between inner surfaces 44, and (ii) provide an interference fit between legs 54 and inner surface 33 of circuit board aperture 30 (FIG. 9).

Retention wings 70 comprise upwardly and outwardly projecting cantilevered beams that lie in the plane defined by upper portion 52 and legs 54. Retention wings 70 include an outer edge 77, an inner edge 78, a top edge 79, and a tip portion 80. Edges 77 and 78 are disposed in substantially parallel relation to one another. Top edge 79 forms an acute angle at its intersection with outer edge 77, and an oblique angle at its intersection with inner edge 78. In a preferred embodiment, top edges 79 are oriented (relative to edges 77 and 78) so as to be in substantially parallel relation to lower surface 42 of shoulder 36 when hold-down device 15 is disposed in cavity 26 (FIG. 9), as will hereinafter be disclosed in further detail. Retention wings 70 are fixed to outer edges 76 at a predetermined position along legs 54 such that the distance between tips 68 of stops 56 and top edges 79 of retention wings 70 is slightly less than the distance between upper surface 40 and bottom surface 42 of shoulders 36 (FIGS. 4, 5, and 9). Each retention wing 70 is sized and positioned on outer edge 76 so as to be capable of flexing resiliently inwardly during insertion of hold-down device 15 into receiving cavity 26, as will hereinafter be disclosed in further detail.

At least one barb 72 is disposed on outer edge 76 of each leg 54, below retention wing 70 and adjacent to end portion 74. Barbs 72 are adapted to fixedly engage inner surface 33 of circuit board 31 (FIG. 9). In a preferred embodiment of the invention, two or three barbs may be positioned adjacent to each end portion 74 of legs 54.

End portions 74 comprise an angled outer edge 82, a blunt tip 86, and an anti-overstress edge 88. Angled outer edge 82 is adapted to reduce the insertion force necessary to insert legs 54 into circuit board aperture 30. Blunt tips 86 are adapted to prevent gouging of circuit board surface 35, and to facilitate entry of end portions 74 into circuit board aperture 30 (FIG. 9). Anti-overstress edges 88 form the inner edge of end portion 74. Anti-overstress edges 88 project inwardly along end portion 74 so as to limit the total deflection of legs 54 during insertion into circuit board aperture 30.

In a preferred embodiment, hold-down device 15 has a rectangular cross-section (FIG. 6) and may be formed as a flat stamping from a strip of spring-tempered metal. Hold down device 15 may be provided with a tin or tin-lead electroplated surface.

Figure 7:
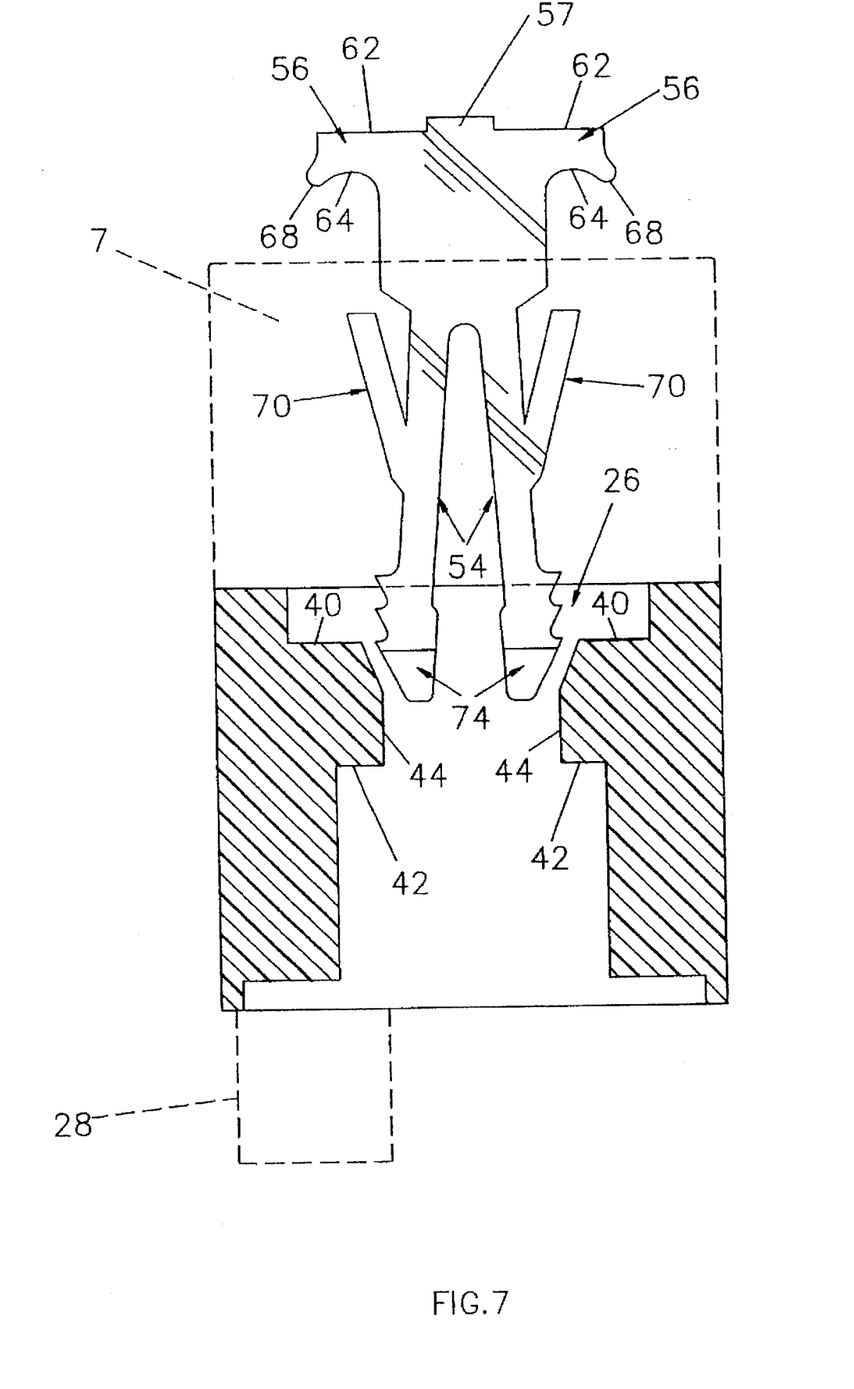
FIG. 7 is a side elevational view, partially in section and partially in phantom, showing a hold-down device positioned above its receiving cavity just prior to assembly of the hold-down device to the insulative housing.
Figure 8:
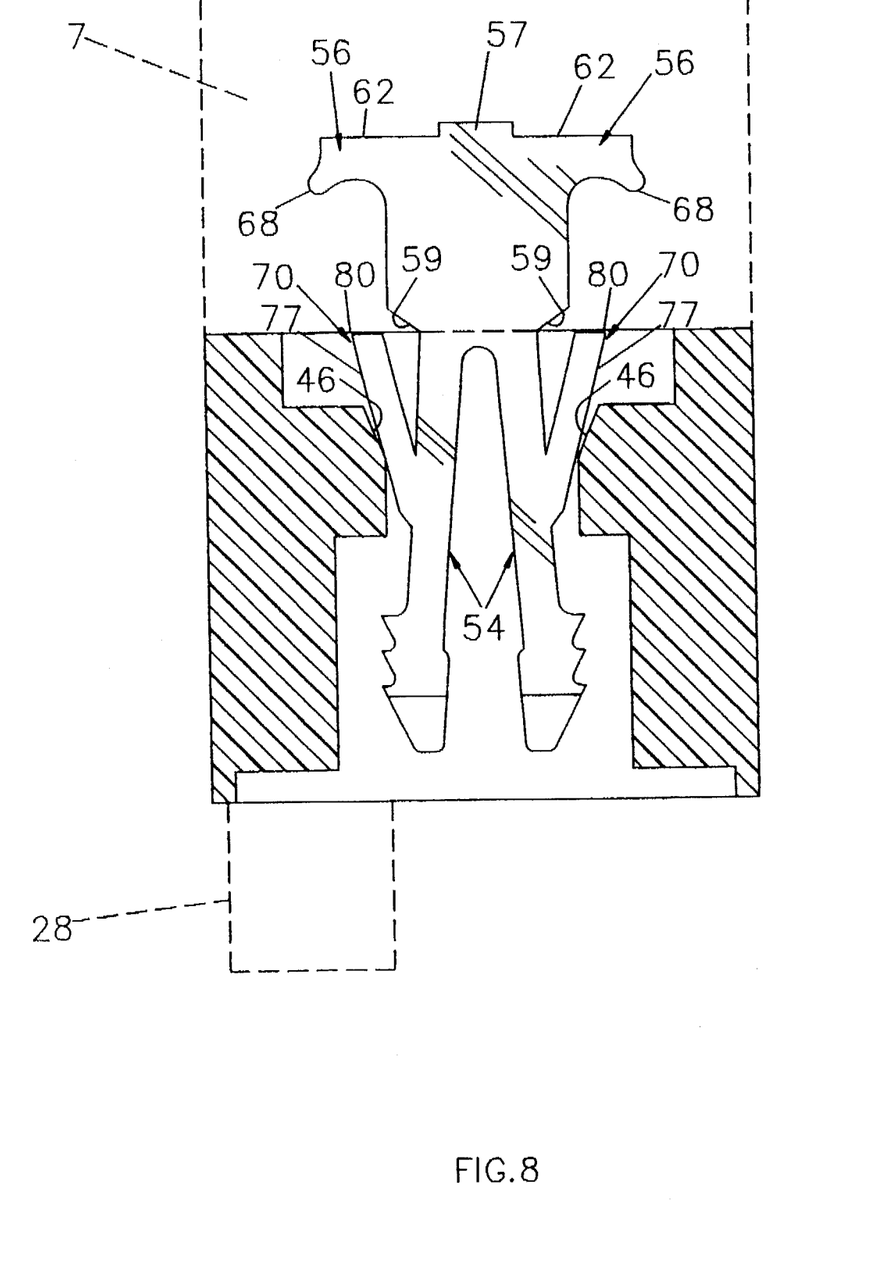
FIG. 8 is a side elevational view, partially in section and partially in phantom, showing a hold-down device partially inserted into its receiving cavity.

Referring now to FIGS. 7–9, hold-down device 15 is assembled to insulative housing 5 in the following manner.

First, hold-down device 15 is oriented with respect to cavity 26 so that end portions 74 are positioned between shoulders 36. An insertion tool (not shown) is then used to push hold-down device 15 into cavity 26. More particularly, the insertion tool presses on tab 57, driving end portions 74 through the gap between shoulders 36. As this occurs, barbs 72 may partially engage shoulders 36 as hold-down device 15 passes through the gap between inner surfaces 44. As seen in FIG. 8, outer edges 77 of retention wings 70 engage chamfered surfaces 46 of shoulders 36 once end portions 74 are in position within lower portion 34 of cavity 26.

Still referring to FIG. 8, as hold-down device 15 continues to move downwardly into cavity 26, and outer edges 77 engage chamfered surfaces 46, retention wings 70 flex resiliently inwardly. As this occurs, top edges 79 and tip portions 80 of wings 70 move inwardly toward chamfered edges 59 of central portion 55. Chamfered edges 59 complement top edges 79 to the extent that clearance is provided for retention wings 70 to flex inwardly in response to outer edges 77 slidingly engaging chamfered surfaces 46 of shoulders 36. In this way, retention wings 70 move out of the way of shoulder 36, and allow hold-down device 15 to fully enter cavity 26.

Once tip portions 80 pass the lower corners of shoulders 36 (defined by the intersection of inner surfaces 44 and lower surfaces 42 of shoulders 36), retention wings 70 flex resiliently outwardly, placing top edges 79 in substantially parallel confronting relation with lower surfaces 42. At the same time, tips 68 of stops 56 resiliently engage upper surfaces 40 of shoulders 36. The resilient interaction of tips 68 with upper surfaces 40 provides hold-down device 15 with just enough additional downward travel of hold-down device 15 into cavity 26 so that tips 80 of retention wings 70 may clear shoulders 36, and thus allow retention wings 70 to flex or "snap" outwardly, under lower surfaces 42.

The insertion tool will have completed its total downward movement when retention wings 70 have fully flexed outwardly, and tab 57 is below top surface 20 of flange 13. Once this has occurred, the insertion tool is removed from tab 57, and the resilient nature of the material comprising shoulders 36, in combination with the resilient nature of tips 68, causes hold-down device 15 to move upwardly with respect to flange 13. As this occurs, top edges 79 are forced into mechanical engagement with lower surfaces 42 of shoulders 36, thus fastening hold-down device 15 in cavity 26. At this point, hold-down device 15 will have been properly assembled to the insulative housing 5 of electrical connector 1.

Referring to FIG. 9, it will be appreciated that a preferred orientation of top edge 79, with respect to edges 77 and 78, will be that which presents the maximum cross-sectional area of top edge 79 to lower surfaces 42, thus maximizing interaction between hold-down device 15 and shoulders 36. This preferred orientation is accomplished by forming top edges 79 so as to be in substantially parallel relation to lower surface 42 of shoulder 36 when retention wings 70 have snapped past the lower corner defined by the intersection of inner surfaces 44 and lower surfaces 42.

Electrical connector assembly 1 may thereafter be assembled to a circuit board 31 in the following manner. Electrical connector assembly 1, with hold-down devices 15 disposed in flanges 13 (as shown in FIGS. 1 and 2), is positioned above top surface 35 of circuit board 31. Electrical connector assembly 1 is then moved toward the surface of circuit board 31 so that polarization post 28 enters its corresponding aperture in circuit board 31. At the same time, end portions 74 of hold-down device 15 engage apertures 30 of circuit board 31 via angled outer edges 82. As angled outer edges 82 slidingly engage the rim of circuit board apertures 30, legs 54 flex resiliently inwardly and barbs 72 engage inner surface 33 of circuit board aperture 30.

In response to legs 54 moving inwardly, retention wings 70 tend to move outwardly, further engaging lower surfaces 42 of shoulders 36. Insertion of electrical assembly 1 onto circuit board 31 is completed when circuit board standoffs 24 engage circuit board surface 35. At this point, barbs 72 will engage inner surface 33 and bind hold-down device 15, and then electrical connector assembly 1, to circuit board 31.

Other embodiments, features and advantages of the present invention are intended to be covered by the spirit and scope of the appended claims.

I claim:

1. A hold-down device adapted to secure an electrical connector assembly to a circuit board, wherein said electrical connector assembly comprises an insulative housing having at least one cavity adapted to receive a respective said hold-down device and having a constriction along said cavity, said hold-down device comprising:

a first portion comprising a pair of stops projecting from opposed side edges thereof and adapted to abut opposed first transverse surfaces of said constriction upon full insertion of said hold-down device into said receiving cavity;

a second portion including a pair of deflectable beams extending from opposed side edges thereof laterally outwardly and toward associated ones of said stops to free ends spaced from said stops a distance corresponding dimensionally to said constriction, each being sized so as to (i) resiliently flex inwardly during insertion of said hold-down device into receiving cavity and (ii) resiliently flex outwardly upon passing associated second transverse surfaces of said constriction spaced a selected distance from said first transverse surfaces thereof, all so as to trap said constriction between said stops and ends of said beams and thereby fasten said hold-down device to said insulative housing; and a board-retention section extending from one of said first and second portions upon full insertion of said hold-down device into said receiving cavity and beyond a board-proximate face thereof, and being adapted to become mechanically engaged with a circuit board to secure said connector assembly thereto.

2. A hold-down device according to claim 1 comprising a unitary planar construction having a uniform thickness.

3. A hold-down device according to claim 1 wherein each of said stops comprise a tip projecting from an outer end thereof, said tip being shaped and dimensioned to be incrementally deflected upon engagement with an opposed said first transverse surface to resiliently engage said first transverse surface within said receiving cavity of said housing.

4. A hold-down device according to claim 1 wherein said board-retention section comprises a pair of legs insertable into a hole of said circuit board and self-retain to said board.

5. A hold-down device according to claim 4 wherein said legs comprise two cantilever beams projecting from said one of said first and second portions in diverging relation so as to be deflectable toward each other upon insertion into said hole of said circuit board and thereafter define an interference fit therewith.

6. A hold-down device according to claim 5 wherein outer edges of ends of said legs define barbs therealong engageable with side walls of said hole to inhibit withdrawal of said hold-down device from said hole after insertion thereinto.

7. A hold-down device according to claim 5 wherein said legs define therebetween deflection limiting surfaces adapted to abut to limit the total inward deflection of said legs upon insertion into said hole.

8. A hold-down device according to claim 1 wherein leading ends of said beams are spaced from tips of associated ones of said stops by a distance that is less than said selected distance between said first and second transverse surfaces of said receiving cavity, and said stops are adapted to be incrementally deflected upon engagement with said opposed first transverse surfaces of said receiving cavity to permit said beam leading ends to clear said second transverse surfaces to resile outwardly and thereafter seat thereagainst.

9. A hold-down device according to claim 8 wherein said board-retention section extends from said second portion, whereby said hold-down device is adapted to be inserted into said receiving cavity from a board-remote face of said insulative housing by insertion of said board-retention section thereinto and beyond a board-proximate face of said housing.

10. A hold-down device according to claim 9 wherein said board-retention section comprises a pair of cantilever legs depending from said second portion and said deflectable beams are joined to side edges of respective ones of said legs to be responsive to inward flexing of said legs when said legs engage side walls of said hole of said circuit board.

11. A hold-down system of an electrical connector assembly to a circuit board, comprising:

a hold-down device including a board-retention section and an insulative connector housing including at least one cavity adapted to receive said hold-down device therewithin such that said board-retention section extends from a board-proximate face thereof and having a constriction along said cavity;

said hold-down device having a first portion comprising a pair of stops projecting from opposed side edges thereof and adapted to abut opposed first transverse surfaces of said constriction upon full insertion of said hold-down device into said receiving cavity;

a second portion including a pair of deflectable beams extending from opposed side edges thereof laterally outwardly and toward associated ones of said stops to free ends spaced from said stops a distance corresponding dimensionally to said constriction, each being sized so as to (i) resiliently flex inwardly during insertion of said hold-down device into said receiving cavity and (ii) resiliently flex outwardly upon passing associated second transverse surfaces of said constriction spaced a selected distance from said first transverse surfaces thereof, all so as to trap said constriction between said stops and ends of said beams and thereby fasten said hold-down device to said insulative housing; and said board-retention section extending from one of said first and second portions upon full insertion of said hold-down device into said receiving cavity and beyond a board-proximate face thereof.

12. The hold-down system according to claim 11 wherein said hold-down device comprises a unitary planar construction having a uniform thickness.

13. The hold-down system according to claim 11 wherein leading ends of said beams are spaced from tips of associated ones of said stops by a distance that is less than said selected distance between said first and second transverse surfaces of said receiving cavity, and said stops are adapted to be incrementally deflected upon engagement with said opposed first transverse surfaces of said receiving cavity to permit said beam leading ends to clear said second transverse surfaces to resile outwardly and thereafter seat thereagainst.

14. The hold-down system according to claim 13 wherein said board-retention section extends from said second portion, whereby said hold-down device is adapted to be inserted into said receiving cavity from a board-remote face of said insulative housing by insertion of said board-retention section thereinto and beyond a board-proximate face of said housing.

15. The hold-down system according to claim 14 wherein said board-retention comprises a pair of cantilever legs depending from said second portion and said deflectable beams are joined to side edges of respective ones of said legs to be responsive to inward flexing of said legs when said legs engage side walls of said hole of said circuit board.

* * * * *